US008054153B2

(12) United States Patent
Jeon et al.

(10) Patent No.: US 8,054,153 B2
(45) Date of Patent: Nov. 8, 2011

(54) VARIABLE INDUCTOR

(75) Inventors: Sang-yoon Jeon, Seoul (KR); Sung-jae Jung, Seoul (KR); Heung-bae Lee, Suwon-si (KR); Dong-hyun Lee, Anyang-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 1240 days.

(21) Appl. No.: 11/513,059

(22) Filed: Aug. 31, 2006

(65) Prior Publication Data

US 2007/0052512 A1 Mar. 8, 2007

(30) Foreign Application Priority Data

Sep. 8, 2005 (KR) ........................ 10-2005-0083712

(51) Int. Cl.
*H01F 5/00* (2006.01)
*H01F 27/28* (2006.01)
*H01L 27/08* (2006.01)

(52) U.S. Cl. ......................... 336/200; 336/232; 257/531

(58) Field of Classification Search .................. 336/200, 336/232; 257/531
See application file for complete search history.

(56) References Cited

U.S. PATENT DOCUMENTS 5,629,553 A * 5/1997 Ikeda et al. ................... 257/531
2004/0018823 A1* 1/2004 Yang et al. .................... 455/296
2004/0140528 A1 7/2004 Kim et al.
2004/0190217 A1 9/2004 Stokes
2005/0052272 A1* 3/2005 Tiebout ......................... 336/232
2005/0068146 A1 3/2005 Jessie
2005/0077992 A1* 4/2005 Raghavan et al. ............ 336/200
2005/0085205 A1* 4/2005 Behzad ...................... 455/226.1
2007/0158782 A1* 7/2007 Heikkinen .................... 257/531

FOREIGN PATENT DOCUMENTS

WO WO 0076057 A1 * 12/2000

OTHER PUBLICATIONS

Park et al.; Variable Inductance Multilayer Inductor With MOSFET Switch Control; Electron Device Letters, IEEE; Mar. 2004; pp. 144-146; vol. 25, Issue 3.*

Yang, Design Considersations of Differential Inductors in CMOS Technology for RFIC, Jun. 6-8, 2004, Radio Frequency Integrated Circuits (RFIC) Symposium 2004, Digest of Papers, 2004 IEEE, pp. 449-452.*

* cited by examiner

*Primary Examiner* — Elvin G Enad
*Assistant Examiner* — Tsz Chan
(74) *Attorney, Agent, or Firm* — Sughrue Mion, PLLC

(57) ABSTRACT

A variable inductor is provided, which includes a first lead having both ends to receive a pair of difference signals, a second lead having both ends to receive a pair of the difference signals, and a switch selectively supplying a pair of the difference signals to the second lead by turning on/off according to a control signal. Accordingly, a variable inductor can be implemented that is compact and maximizes the variation rate of inductance.

13 Claims, 8 Drawing Sheets

100

VARIABLE INDUCTOR

CROSS-REFERENCE TO RELATED APPLICATIONS

This application claims priority from Korean Patent Application No. 10-2005-0083712, filed Sep. 8, 2005 in the Korean Intellectual Property Office, the entire contents of which are incorporated herein by reference.

BACKGROUND OF THE INVENTION

1. Field of the invention

Apparatuses consistent with the present invention relate to a variable inductor, and more particularly, to an inductor for varying inductance according to an external control signal.

2. Description of the Related Art

In general, a communications device such as a mobile phone employs semiconductor chip elements to implement a circuit for radio frequency communications. An inductor element is essential to implement such semiconductor chip elements. In particular, a voltage control oscillator (VCO) including an inductor may be used to configure a radio frequency communications circuit for communication at a desired frequency. In these and other applications, an inductor is needed that is compact in design while also having a high inductance and quality factor.

FIG. 1 is a view showing an example of a general VCO.

Referring to FIG. 1, a VCO 10 includes an LC tank 11 consisting of an inductor L and a capacitor C and a negative resistance part 12 consisting of a pair of cross-coupled transistors M1 and M2. The VCO 10 outputs an oscillation frequency according to a resonance frequency of the LC tank 11. Accordingly, inductance of the inductor L of the LC tank 11 varies so that the oscillation frequency varies.

As wireless communications services develops, different frequency bands are used. Examples of such different frequency bands include 800 MHz for cell phones, 1.9 GHz for Personal Communications Services (PCS), and 2.4 GHz and 5 GHz for wireless Local Area Networks (LAN), and other various frequency bands. Accordingly, a multi-band VCO that is capable of providing at least two radio frequencies (RF) that are used in the different frequency bands is required and a variable inductor providing a varying inductance is also needed.

FIG. 2 is a view showing an example of a related art variable inductor and is disclosed in U.S. Patent Publication No. 2004/0140528. Referring to FIG. 2, plural inductors 21-28 are stacked in order on a substrate and plural switches 31-33 are on/off controlled according to an external control signal so that inductance varies by the plural inductors 21-28. In the structure of such variable inductors as shown in FIG. 2, the inductors are stacked on the substrate so that additional space is not needed. However, the distance between the substrate and the inductors becomes short. As a result, Q-factor is low and the height of the structure is increased.

FIGS. 3A-3C are views showing another example of a related art variable inductor and is disclosed in U.S. Patent Publication No. 2004/0190217. Referring to FIGS. 3A-3C, the related art variable inductor includes the first inductor 42, which is fixed in position, and the second inductor 44, which is movable in left and right directions. As shown in FIG. 3A-3C, inductance varies according to the movement of the second inductor 44. However, a Micro-Electro-Mechanical Systems (MEMS) process is used so that it is difficult for such an implementation be integrated in one chip.

FIGS. 4A and 4B are views showing yet another example of a related art variable inductor and is disclosed in U.S. Patent Publication No. 2005/0068146. Referring to FIG. 4A, the related art variable inductor 50 includes the first inductor 51 which is spiral and the second inductor 52 which is loop-shaped and open and closed by a switch 53. FIG. 4A shows that when the second inductor 52 is open, the electric current does not flow in the second inductor 52 and inductance of the variable inductor 50 depends on the first inductor 51. FIG. 4B shows that when the second inductor 52 is closed by the switch 53, magnetic flux is generated in the direction of canceling magnetic flux by the electric current flowing in the first inductor 51 due to eddy current flowing in the second inductor 52. Accordingly, inductance of the variable inductor 50 in FIG. 4B becomes lower than that in FIG. 4A. In the variable inductor 50 of FIGS. 4A and 4B, the variation rate of inductance is low because inductance variation depends on eddy current flowing in the second inductor 52 according to the on or off state of the switch 53.

SUMMARY OF THE INVENTION

Exemplary embodiments of the present invention overcome the above disadvantages and other disadvantages not described above. Also, the present invention is not required to overcome the disadvantages described above, and an exemplary embodiment of the present invention may not overcome any of the problems described above.

The present invention provides a variable inductor which is compact and maximizes the variation rate of inductance.

According to an aspect, a variable inductor is provided, comprising: a first lead which receives a pair of difference signals at a first end and a second end of the first lead, respectively; a second lead which receives the pair of difference signals at a first end and a second end of the second lead, respectively; and a switch which selectively supplies the pair of difference signals to the second lead by turning on or off in response to a control signal.

The first magnetic flux generated by a first electric current flowing in the first lead in a first direction and a second magnetic flux by a second electric current flowing in the second lead in a second direction from the pair of the difference signals, which are received by the first lead and the second lead, may counteract each other.

Also, the first lead may be formed in a double spiral shape.

Additionally, the first lead may comprise a first spiral lead receiving a first difference signal, which is one of the pair of difference signals, at one end of the first spiral lead, the first spiral lead having a radius which gradually decreases in a spiral shape relative to a virtual center and a second spiral lead, which is connected to another end of the first spiral lead at one end of the second spiral lead, wherein a spiral shape of the second spiral lead gradually increases in radius relative to the virtual center, and another end of the second spiral lead receives a second difference signal having a phase difference of 180° relative to the first difference signal which is supplied to the first spiral lead.

The first spiral lead and the second spiral lead may be symmetrical with respect to a virtual line passing through the virtual center.

Further, the first spiral lead and the second spiral lead may overlap each other on the virtual line that passes through the virtual center such that overlapping parts of the first spiral lead and the second spiral lead are disposed at a distance from each other.

In addition, the first spiral lead and the second spiral lead may be on an identical plane except the overlapping parts of the first spiral lead and the second spiral lead which overlap on the virtual line.

The second lead may be formed on the identical plane in a loop shape relative to the virtual center, with the first end of the second lead receiving the first difference signal and the second end of the second lead receiving the second difference signal.

The switch may comprise a first transistor including a source terminal, a drain terminal, and a gate terminal, wherein the source terminal of the first transistor is connected to the first end of the first lead, the drain terminal of the first transistor is connected to the first end of the second lead, and the gate terminal of the first transistor receives the control signal; and a second transistor including a source terminal, a drain terminal, and a gate terminal, wherein the source terminal of the second transistor is connected to the second end of the first lead, the drain terminal of the second transistor is connected to the second end of the second lead, and gate terminal of the second transistor is common-connected to the gate terminal of the first transistor to receive the control signal together.

The first transistor and the second transistor may be turned on to supply the pair of difference signals to the first end and the second end of the second lead if the control signal is at a high level, and the first transistor and the second transistor are turned off and do not supply the pair of difference signals to the second lead if the control signal is at a low level.

Further, the pair of difference signals may be applied to the first lead and the second lead such that the first lead and second lead are positively mutually coupled. The direction of current flow in the first lead and the second lead may be identical such that magnetic flux generated by current flow in the first lead is increased by magnetic flux generated by current flow in the second lead.

BRIEF DESCRIPTION OF THE DRAWING FIGURES

The above and other aspects of the present invention will become more apparent by describing in detail exemplary embodiments thereof with reference to the attached drawing figures, wherein.

DETAILED DESCRIPTION OF THE EXEMPLARY EMBODIMENTS

Figure 1:
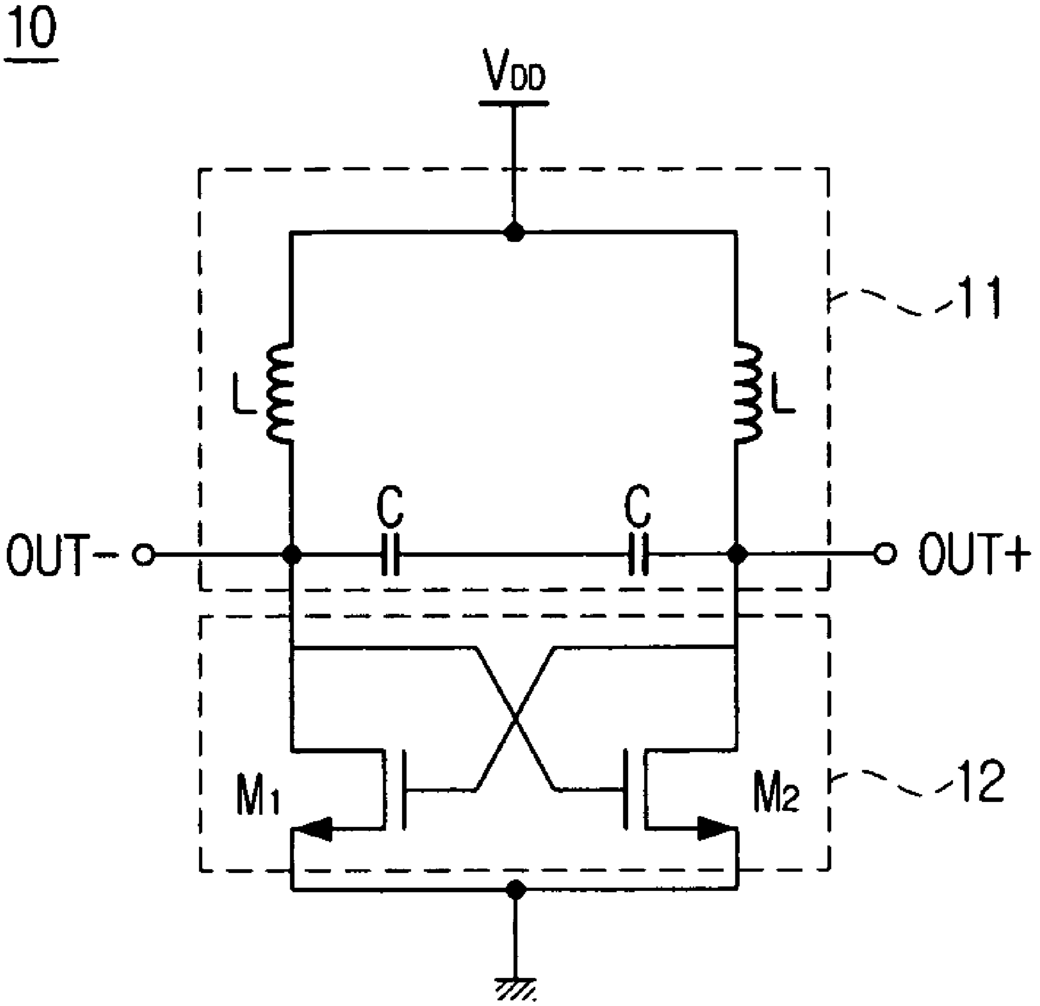
FIG. 1 is a view showing an example of a general VCO.
Figure 2:
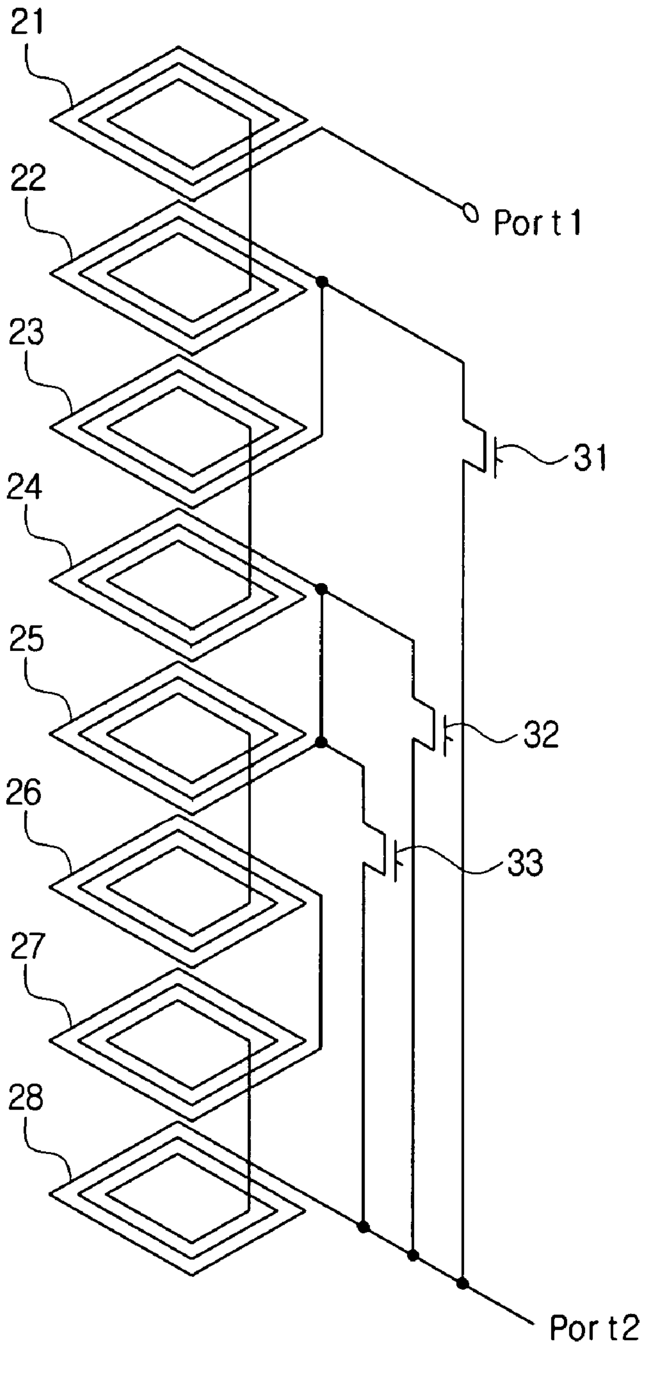
FIG. 2 is a view showing an example of a related art variable inductor.
Figure 3A:
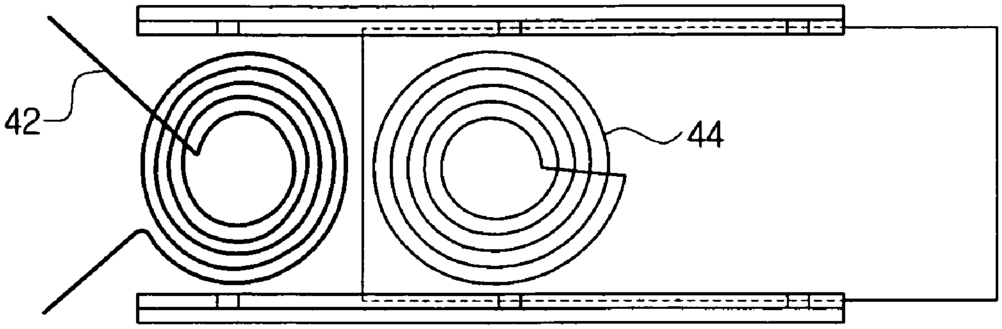
FIGS. 3A to 3C are views showing another example of a related art variable inductor.
Figure 3B:
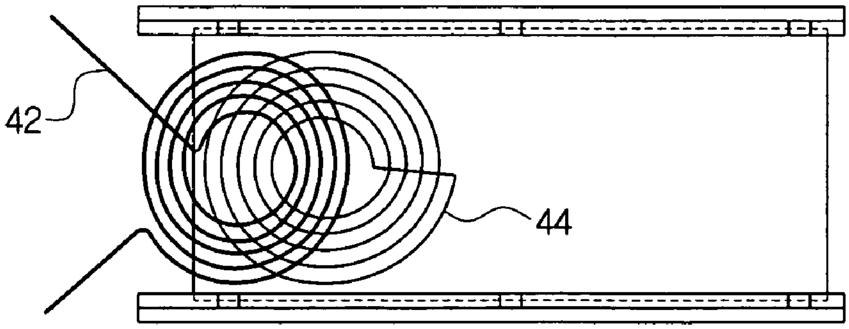
Figure 3C:
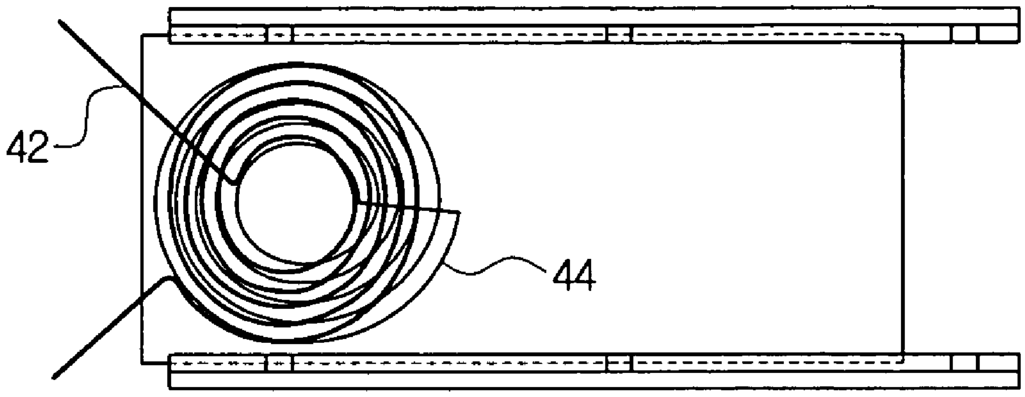
Figure 4A:
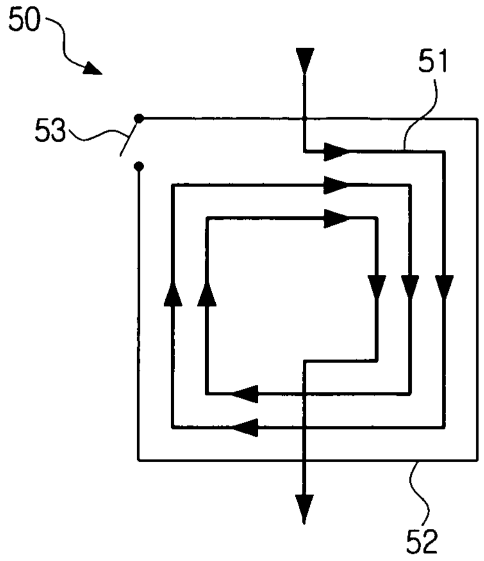
FIGS. 4A and 4B are views showing yet another example of a related art variable inductor.
Figure 4B:
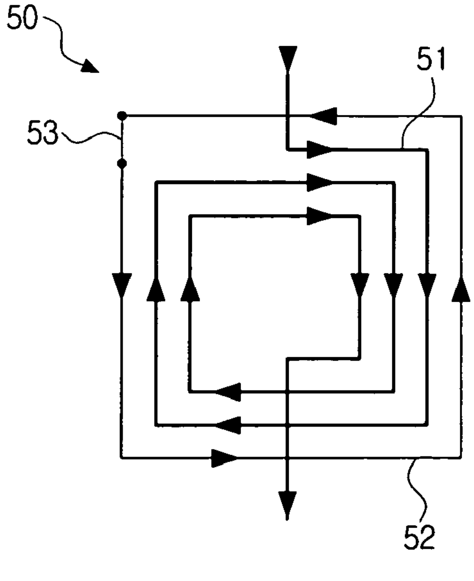

Hereinafter, exemplary embodiments of the present invention will be described in detail with reference to the accompanying drawing figures.

In the following description, same drawing reference numerals are used for the same elements even in different drawings. The matters defined in the description such as a detailed construction and elements are provided to assist in a comprehensive understanding of the invention. Thus, it is apparent that the present invention can be carried out without those defined matters. Also, well-known functions or constructions are not described in detail since they would obscure the invention in unnecessary detail.

Figure 5:
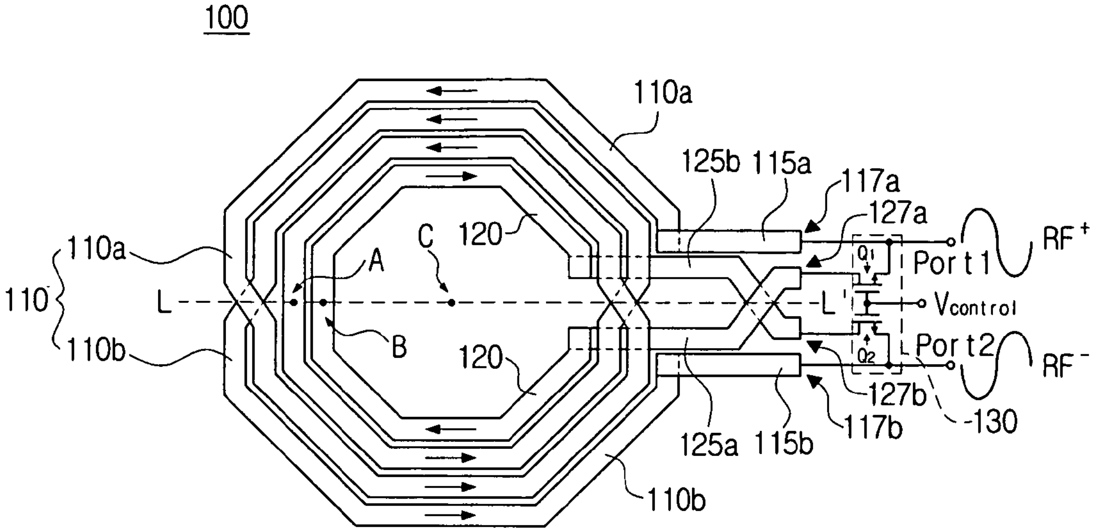
FIG. 5 is a view showing the configuration of a variable inductor according to an exemplary embodiment of the present invention.

FIG. 5 is a view showing the configuration of a variable inductor according to an exemplary embodiment of the present invention.

Referring to FIG. 5, a variable inductor 100 according to an exemplary embodiment of the present invention includes a first lead 110, a second lead 120 and a switch 130.

The first lead 110 is made of a conductive medium, such as metal, to conduct the flow of electric current from a pair of difference signals, $RF^+$, $RF^-$, which are supplied to both ends 117*a*, 117*b* of the first lead 110. The first lead 110 has a double spiral structure which gradually decreases in radially inward on the basis of virtual center C and from a certain location A gradually increases in the radius again. A pair of the difference signal $RF^+$, $RF^-$ means a pair of difference electric currents or a pair of difference voltages.

The first lead 110 includes a first spiral lead 110*a*, a second spiral lead 110*b*, a first lead connector 115*a* and a second lead connector 115*b*. The radius of the first spiral lead 110*a* gradually decreases on the basis of virtual center C from one end connected to the first lead connector 115*a* to the location A. Also, the radius of the second spiral lead 110*b* gradually increases radially inward on the basis of virtual center C from the location A to the second lead connector 115*b*. In addition, overlapping parts of the first spiral lead 110*a* and the second spiral lead 110*b* on a virtual line LL' are distanced away from each other. The first spiral lead 110*a* and the second spiral lead 110*b* may be symmetrical to each other on the basis of the virtual line LL'. Additionally, the first spiral lead 110*a* and the second spiral lead 110*b* may be on the same plane except for the overlapping parts.

In FIG. 5, the first lead 110 may be configured as a polygon but also can be implemented with a circular shape. In addition, the first lead 110 may be implemented to receive a pair of the difference signals $RF^+$, $RF^-$ through the first and second lead connectors 115*a*, 115*b*. However, first lead 110 may also be implemented to directly receive a pair of the difference signals $RF^+$, $RF^-$ without the first and second lead connectors 115*a*, 115*b*.

The second lead 120 is made of a conductive medium, such as metal, to conduct the flow of electric current from a pair of the difference signals $RF^+$, $RF^-$ which are supplied to both ends 127*a*, 127*b* of the second lead 120. The second lead 120 can be formed in a loop shape inside or outside of the first lead 110 on the plane where the first lead 110 is formed. Additionally, to increase inductance variation of the variable inductor 100, the second lead 120 may also be formed in a double spiral shape.

The second lead 120 is implemented to receive a pair of the difference signals $RF^+$, $RF^-$ through the third and fourth lead connectors 125*a*, 125*b*. However, the second lead 120 may also be implemented to directly receive a pair of the difference signals $RF^+$, $RF^-$ without the third and fourth lead connectors 125*a*, 125*b*.

The switch 130 is turned on or off according to a control signal (V control), which thereby controls whether or not a pair of the difference signals $RF^+$, $RF^-$ are supplied to the second lead 120. The switch 130 selectively supplies a pair of the difference signals $RF^+$, $RF^-$ to the second lead 120 so that inductance of the variable inductor 100 can vary.

The variation of inductance of the variable inductor 100 according to an exemplary embodiment of the present invention is described next. For example, when the switch 130 is turned off, the electric current from a pair of the difference signals $RF^+$, $RF^-$ flows only in the first lead 110, and not in the second lead 120. Accordingly, inductance of the variable inductor 100 is the same as that of an inductor having only the first lead 110.

Conversely, when the switch 130 is turned on, the electric current from a pair of the difference signals $RF^+$, $RF^-$ flows in both the first lead 110 and the second lead 120. As shown in FIG. 5, when the electric current flows in a counterclockwise direction in the first lead 110, the electric current flows in a clockwise direction in the second lead 120. Accordingly, the direction of the electric currents are opposite to each other so that magnetic flux from the electric current flowing in the first lead 110 and magnetic flux from the electric current flowing in the second lead 120 counteract each other. That is, the first lead 110 and the second lead 120 form a negative mutual coupling. Therefore, inductance of the variable inductor 100 becomes smaller than when the switch 130 is turned off.

More specifically, the switch 130 may be implemented by first and second transistors Q1, Q2. The source terminal of the first transistor Q1 is connected to one end 117*a* of the first lead 110, the drain terminal of the first transistor Q1 is connected to one end 127*a* of the second lead 120, and the gate terminal of the first transistor Q1 is connected to the gate of the second transistor Q2. The source terminal of the second transistor Q2 is connected to the other end 117*b* of the first lead 110, the drain terminal of the second transistor Q2 is connected to the other end 127*b* of the second lead 120, and the gate terminal of the second transistor Q2 is connected to the gate terminal of the first transistor Q1. The first transistor Q1 and the second transistor Q2 receive a pair of the difference signals $RF^+$, $RF^-$ through each source terminal, respectively.

If the V control signal supplied to the gates is at a high level (e.g., approximately 1.8V), then the first transistor Q1 and the second transistor Q2 are turned on and the electric current pathway is formed between the source and drain terminals so that a pair of the difference signals $RF^+$, $RF^-$ are supplied to both ends 127*a*, 127*b* of the second lead 120.

Conversely, if the V control signal supplied to the gates is at a low level (e.g., approximately 0V), then the first transistor Q1 and the second transistor Q2 are turned off and the second lead 120 is electrically open so that a pair of the difference signals $RF^+$, $RF^-$ are not supplied to both ends 127*a*, 127*b* of the second lead 120.

In this exemplary embodiment, the first transistor Q1 and the second transistor Q2 can be implemented with N channel metal-oxide semiconductor field effect transistor (MOSFET), and a pair of the difference signals $RF^+$, $RF^-$ can be implemented to be selectively supplied to both ends 127*a*, 127*b* of the second lead 120 using another switch element. However, exemplary embodiments are not restricted to MOSFETs, and other transistor implementations are envisioned.

Meanwhile, when a pair of the difference signals are supplied to both ends of wire, the middle of the wire is virtually grounded for alternating component current flow. Accordingly, if a pair of the difference signals $RF^+$, $RF^-$ are supplied to both ends 117*a*, 117*b* of the first lead 110, the middle A of the first lead 110 is virtually grounded. Likewise, if a pair of the difference signals $RF^+$, $RF^-$ are supplied to both ends 127*a*, 127*b* of the second lead 120, the middle B of the second lead 120 is virtually grounded. Based on this, an equivalent circuit model of the variable inductor of FIG. 5 will be described.

Figure 6A:
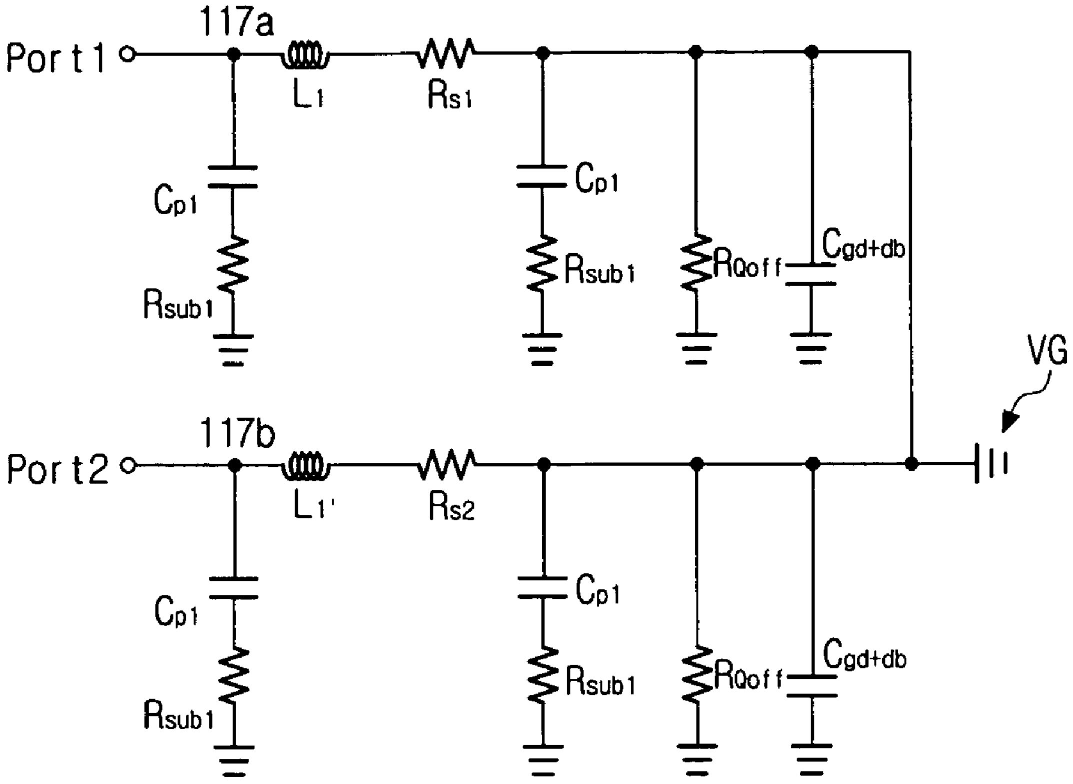
FIG. 6A is a view showing an equivalent circuit model when the switch is turned off in the variable inductor of FIG. 5.
Figure 6B:
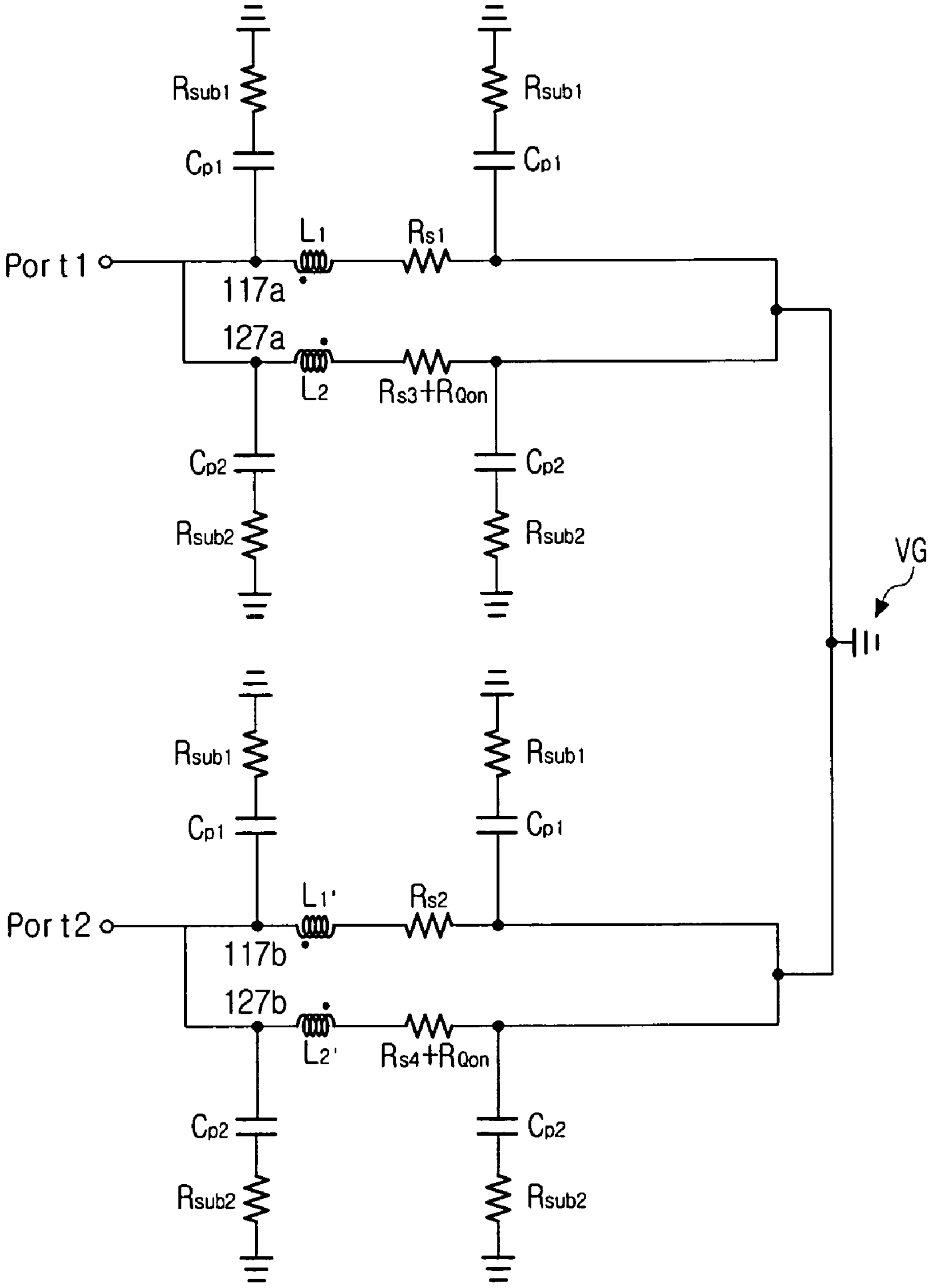
FIG. 6B is a view showing an equivalent circuit model when the switch is turned on in the variable inductor of FIG. 5.

FIG. 6A is a view showing an equivalent circuit model when the switch is turned off in the variable inductor of FIG. 5 and FIG. 6B is a view showing an equivalent circuit model when the switch is turned on in the variable inductor of FIG. 5.

First, as shown in FIGS. 6A and 6B, 'Rsub1' is a parasitic resistance between the first spiral lead 110*a* and a substrate (not shown), and 'Rsub2' is a parasitic resistance between the second spiral lead 110*b* and the substrate. 'Cp1' is a parasitic capacitance between the first spiral lead 110*a* and the substrate, and 'Cp2' is a parasitic capacitance between the second spiral lead 110*b* and the substrate. 'Rs1' is a serial resistance of the first spiral lead 110*a* and 'Rs2' is a serial resistance of the second spiral lead 110*b*. 'Rs3' is a serial resistance from one end 127*a* of the second lead 120 to the middle B of the second lead 120 which is virtually grounded and 'Rs4' is a serial resistance from the other end 127*b* of the second lead 120 to the middle B of the second lead 120 which is virtually grounded. '$R_{Qon}$' is a resistance when the switch 130 is turned on, and is approximately 2.5Ω which is so small. '$RQ_{Off}$' is a resistance when the switch 130 is turned off, and is infinite. '$C_{gd+db}$' is a parasitic capacitance when the switch 130 is turned off.

Here, an effect on the parasitic resistance, the parasitic capacitance and the resistance of the switch 130 is comparatively small relative to an effect on inductance by the first lead 110 and the second lead 120 such that the effect on the parasitic resistance, and the parasitic capacitance and the resistance of the switch 130 can be effectively ignored.

Accordingly, when the switch 130 is turned off, the variable inductor 100 has circuit characteristics as shown in FIG. 6A. That is, an inductor L1 corresponding to the first spiral lead 110*a* is located between a port 1 and a virtual ground (VG), and an inductor L1' corresponding to the second spiral lead 110*b* is located between a port 2 and the VG. This is the same structure as a pair of inductors constructing the LC tank 11 of FIG. 1. Here, the first spiral lead 110*a* and the second spiral lead 110*b* are symmetrical to each other on the basis of the virtual line LL' so that inductance of the inductor L1 is the same as inductance of the inductor L1'.

Meanwhile, when the switch 130 is turned on, as shown the variable inductor 100 of FIG. 6B, an inductor L1 corresponding to the first spiral lead 110*a* and an inductor L2 corresponding to from one end 127*a* of the second lead 120 to the middle B of the second lead 120 performs negative mutual coupling and are located in parallel between the port 1 and the VG. Additionally, in the variable inductor 100, an inductor L1' corresponding to the second spiral lead 110*b* and an inductor L2' corresponding to from the other end 127*b* of the second lead 120 to the middle B of the second lead 120 performs negative mutual coupling and are located in parallel between the port 2 and the VG.

Thus, when the switch 130 is turned on, the variable inductor 100 has the same structure as a pair of inductors constructing the LC tank 11 of FIG. 1. However, the inductor L1, inductor L2, inductor L1' and inductor L2', respectively perform negative mutual coupling and are connected in parallel so that inductance becomes smaller than when the switch 130 is turned off.

Accordingly, the variable inductor 100 according to an exemplary embodiment of the present invention can be used with a pair of inductors constructing the LC tank 11 of the VCO 10 in FIG. 1 and inductance varies according to V control so that oscillation frequency of the VCO 10 can easily vary.

Until now, the exemplary embodiment of the present invention has been described with respect to pair of difference signals RF$^+$, RF$^-$ being supplied to the first lead 110 and the second lead 120 such that the electric currents flow in opposite directions. However, the electric current can also flow in the first lead 110 and the second lead 120 in the same direction. In that case, the first lead 110 and the second lead 120 form positive mutual coupling so that inductance of the variable inductor 100 becomes larger than when the switch 130 is turned off.

As can be appreciated from the above description, an inductor is capable of varying inductance according to a control signal.

In addition, the first lead constructing the variable inductor is formed in a double spiral shape on a plane and the second lead selectively receiving a pair of difference signals is formed on the same plane so that Q-factor improves and the size where the inductor occupies decreases.

Further, a pair of the difference signals are selectively supplied to the second lead to vary inductance so that the variation rate of inductance is maximized compared to the conventional method.

While the invention has been shown and described with reference to exemplary embodiments thereof, it will be understood by those skilled in the art that various changes in form and details may be made therein without departing from the spirit and scope of the invention as defined by the appended claims and their full scope of equivalents.

What is claimed is:

1. A variable inductor, comprising:

a first inductor which receives a pair of difference signals at a first end and a second end of the first inductor, respectively;

a second inductor which receives the pair of difference signals at a first end and a second end of the second inductor, respectively; and a switch which selectively supplies the pair of difference signals to the second inductor by turning on or off in response to a control signal, wherein a first magnetic flux generated by a first electric current flowing in the first inductor in a first direction from the pair of difference signals received at the first and second end of the first inductor and a second magnetic flux generated by a second electric current flowing in the second inductor in a second direction from the pair of the difference signals received at the first and second end of the second inductor, and the first and second magnetic fluxes counteract each other.

2. The variable inductor of claim 1, wherein the first direction of the first electric current flowing in the first inductor is counterclockwise and the second direction of the second electric current flowing in the second inductor is clockwise.

3. The variable inductor of claim 1, wherein the first lead inductor has a spiral shape.

4. The variable inductor of claim 3, wherein the spiral shape of the first lead inductor is a double spiral shape.

5. The variable inductor of claim 1, wherein the first lead inductor comprises:

a first spiral lead inductor receiving a first difference signal, which is one of the pair of difference signals, at one end of the first spiral lead inductor, said first spiral lead inductor having a radius which gradually decreases in a spiral shape relative to a virtual center; and a second spiral lead inductor, which is connected to another end of the first spiral lead inductor at one end of the second spiral lead inductor, wherein a spiral shape of the second spiral lead inductor gradually increases in radius relative to the virtual center, and another end of the second spiral lead inductor receives a second difference signal having a phase difference of 80° relative to the first difference signal which is supplied to the first spiral lead inductor.

6. The variable inductor of claim 5, wherein the first spiral lead inductor and the second spiral lead inductor are symmetrical with respect to a virtual line that passes through the virtual center.

7. The variable inductor of claim 6, wherein the first spiral lead inductor and the second spiral lead inductor overlap each other on the virtual line that passes through the virtual center such that overlapping parts of the first spiral lead inductor and the second spiral lead inductor are disposed at a distance from each other.

8. The variable inductor of claim 6, wherein the first spiral lead inductor and the second spiral lead inductor are on an identical plane except the overlapping parts of the first spiral lead inductor and the second spiral lead inductor which overlap on the virtual line.

9. The variable inductor of claim 1, wherein the second lead inductor is formed on the identical plane in a loop shape relative to a virtual center, with the first end of the second lead inductor receiving the first difference signal and the second end of the second lead inductor receiving the second difference signal.

10. The variable inductor of claim 1, wherein the switch comprises:

a first transistor including a source terminal, a drain terminal, and a gate terminal, wherein the source terminal of the first transistor is connected to the first end of the first lead inductor, the drain terminal of the first transistor is connected to the first end of the second lead inductor, and the gate terminal of the first transistor receives the control signal; and a second transistor including a source terminal, a drain terminal, and a gate terminal, wherein the source terminal of the second transistor is connected to the second end of the first lead inductor, the drain terminal of the second transistor is connected to the second end of the second lead inductor, and the gate terminal of the second transistor is common-connected to the gate terminal of the first transistor to receive the control signal together.

11. The variable inductor of claim 10, wherein the first transistor and the second transistor are turned on to supply the pair of difference signals to the first end and the second end of the second lead inductor if the control signal is at a high level, and the first transistor and the second transistor are turned off and do not supply the pair of difference signals to the second lead inductor if the control signal is at a low level.

12. The variable inductor of claim 1, wherein the pair of difference signals are applied to the first lead inductor and the second lead inductor such that the first lead inductor and second lead inductor are positively mutually coupled.

13. The variable inductor of claim 12, wherein a direction of current flow in the first lead inductor and the second lead inductor is identical such that magnetic flux generated by current flow in the first lead inductor is increased by magnetic flux generated by current flow in the second lead inductor.

* * * * *